(12) United States Patent  (10) Patent No.: US 8,446,748 B2
Lam et al.  (45) Date of Patent: May 21, 2013

(54) CONTENT ADDRESSABLE MEMORIES WITH WIRELINE COMPENSATION

(75) Inventors: Chung Hon Lam, Peekskill, NY (US); Jing Li, Ossining, NY (US); Robert Montoye, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 102 days.

(21) Appl. No.: 13/198,292

(22) Filed: Aug. 4, 2011

(65) Prior Publication Data
US 2013/0033915 A1 Feb. 7, 2013

(51) Int. Cl.
*G11C 15/04* (2006.01)

(52) U.S. Cl.
USPC ........................................ 365/49.1; 365/189.2

(58) Field of Classification Search
USPC ............................................ 365/49.1, 189.2
See application file for complete search history.

(56) References Cited

U.S. PATENT DOCUMENTS

| | | | |
|---|---|---|---|
| 7,120,040 B2 | 10/2006 | Perry et al. | |
| 7,170,769 B1 | 1/2007 | Sachan et al. | |
| 7,319,608 B2 | 1/2008 | Hsu et al. | |
| 7,751,218 B2 | 7/2010 | Arsovski | |
| 7,804,699 B2 | 9/2010 | Gupta et al. | |
| 7,830,691 B2 | 11/2010 | Srinivasan et al. | |
| 2003/0167451 A1 * | 9/2003 | Igarashi | 716/5 |
| 2006/0047490 A1 * | 3/2006 | Breiland et al. | 703/14 |
| 2009/0034311 A1 | 2/2009 | Bosshart | |
| 2010/0226161 A1 | 9/2010 | Ji et al. | |

OTHER PUBLICATIONS

Mohan, N., et al., "Design Techniques and Test Methodology for Low-Power TCAMs," IEEE Transactions on Very Large Scale Integration (VLSI) Systems, vol. 14, No. 6, Jun. 2006.

Mohan, N., et al., "Low-Capacitance and Charge-Shared Match Lines for Low-Energy High-Performance TCAMs," IEEE Journal of Solid-State Circuits, vol. 42, No. 9, Sep. 2007.

\* cited by examiner

*Primary Examiner* — Michael Tran
(74) *Attorney, Agent, or Firm* — Jon A. Gibbons; Fleit Gibbons Gutman Bongini & Bianco PL

(57) ABSTRACT

What is disclosed is a novel memory array and process for creating a memory array to reduce wireline variability. The method includes accessing a routing design of a memory array with a plurality of memory cells. Each memory cell in the array includes one or more access devices, and a group of wires electrically connected between one or more of the memory cells and peripheral circuitry (PC). The group of the group of wires is divided into at least one subgroup (N). Next, a capacitance (C1, C2 . . . CN) of each wire in the subgroup (N) is calculated. Continuing further, a maximum capacitance (CMAX) of wires in the subgroup (N) is determined. An add-on capacitance to be added to a number (NA) of the wires in the subgroup (N) is calculated.

16 Claims, 8 Drawing Sheets

CONTENT ADDRESSABLE MEMORIES WITH WIRELINE COMPENSATION

FIELD OF THE INVENTION

The present invention generally relates to design of memory arrays and, more specifically, to wireline routing from cells of the memory array to peripheral circuitry.

BACKGROUND OF THE INVENTION

Memory arrays include content addressable memory (CAM) used for high performance data search in computers. Most CAM devices utilize static random access memory (SRAM) as data storage devices (utilizing transistors to store information), and additional transistors and complementary transistors for search operations. Often in these CAM devices, search-line access elements and word-line access elements are necessary to operate and program individual memory cells in the memory arrays. These search-line access elements and word-line access elements are often comprised of power intensive, large drive field effect transistors (FET's).

Phase change material can also be utilized to store information for CAM devices. Information is stored in materials that can be manipulated into different phases. Each of these phases exhibits different electrical properties that can be used for storing information.

Chalcogenides are a group of materials commonly utilized as phase change material. They typically contain a chalcogen (Periodic Table Group 16/VIA) and a more electropositive element. Selenium (Se) and tellurium (Te) are the two most common semiconductors in the group used to produce a chalcogenide when creating a phase change memory cell. An example of this is $Ge_2Sb_2Te_5$ (GST), SbTe, and $In_2Se_3$. However, some phase change materials do not utilize chalcogen, such as GeSb. Thus, a variety of materials can be used in a phase change memory cell.

Phase change memory (PCM) technology has lead to increased density enhancements in TCAM/CAM. In search operation, reference match line (ML) timing using resistive-capacitive (RC) sensing schemes is employed to differentiate the search results of "matching", "non-matching", and "don't care". However, RC based sensing schemes are very sensitive to non-idealities, including resistance variability and capacitance mismatch across the match lines.

SUMMARY OF THE INVENTION

One aspect of the invention is a novel method for reducing wireline variability. The method includes accessing a routing design of a memory array with a plurality of memory cells. In one example, the routing design of the memory includes a total area constraint (A) of additional routing lines available. Each memory cell in the array includes one or more access devices, and a group of wires electrically connected between one or more of the memory cells and peripheral circuitry (PC). The group of wires is divided into at least one subgroup (N). Next, a capacitance (C1, C2 ... CN) of each wire in the subgroup (N) is calculated. Continuing further, a maximum capacitance (CMAX) of wires in the subgroup (N) is determined. An add-on capacitance to be added to a number (NA) of the wires in the subgroup (N) is calculated. This add-on capacitance is calculated to minimize a difference between the maximum capacitance (CMAX) and a compensated wire capacitance defined as the add-on capacitance plus the capacitance of each wire (C1, C2 ... CN)) to maximize NA, with NA≦N. In an example, where the total area constraint (A) of the additional routing lines available is considered, calculating the area of the add-on capacitance to be added is not greater than the total area constraint (≦A).

Another aspect of the invention is a novel memory array. The memory array includes a plurality of memory cells, with each memory cell including one or more access devices, and a group of wires electrically connected between one or more of the memory cells and peripheral circuitry (PC). Selected from the group of wires is at least one subgroup (N) of wires. A group of compensation wires is added to the subgroup of wires (N), and electrically connected between one or more of the memory cells and the peripheral circuitry (PC). The group of compensation wires includes an add-on capacitance added to a number (NA) of the wires in the subgroup (N) in order to minimize a difference between the maximum capacitance (CMAX) and a compensated wire capacitance defined as the add-on capacitance plus a capacitance of each wire (C1, C2 ... CN)) in the subgroup (N) of wires to maximize NA, with NA≦N.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
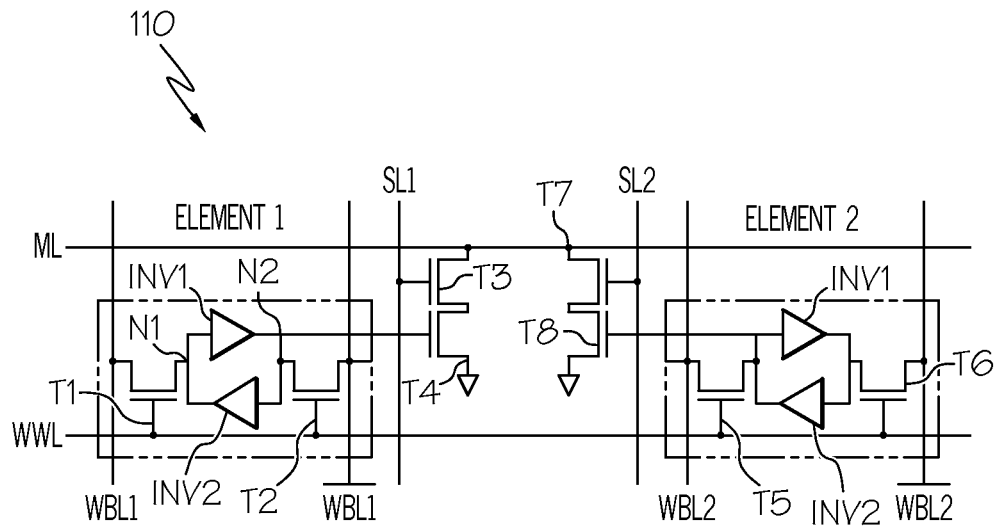
FIG. 1 illustrates a cell of a prior art SRAM TCAM.

The present invention is described with reference to embodiments of the invention. However, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the disclosed subject matter in virtually any appropriately detailed structure and function. Further, the terms and phrases used herein are not intended to be limiting, but rather, to provide an understandable description.

The terms "a" or "an", as used herein, are defined as one or more than one. The term plurality, as used herein, is defined as two or more than two. The term another, as used herein, is defined as at least a second or more. The terms "including" and "having" as used herein, are defined as comprising (i.e. open language). The term "coupled" as used herein, is defined as "connected" although not necessarily directly, and not necessarily mechanically. The terms bitline (BL) and matchline (ML) are used interchangeably herein. The term BL is typically used with general memory and ML used with CAM. Wireline is used to refer to physical electrical connections to the storage elements used with CAMs such as bitlines (BL) and matchlines (ML).

The present invention provides efficient wireline compensation techniques that reduce timing uncertainties. This improved wireline compensation works well with higher density TCAM/CAM that use resistive-capacitive (RC) sensing schemes. Specifically, the present invention improves the sensing margin in RC-based sensing schemes whether due to phase change memory (PCM) variability, such as variability in resistance (R), and/or matchline (ML) variability, in which capacitance (C) variability is often the dominating factor. The present invention reduces the resistance-capacitance (RC) variability of matchlines (ML). Although examples are directed to CAMS and TCAMS including phase change memory (PCM) TCAM/CAMS, other examples include applying the methods and layouts to other types of memory cells, as well. Further, the wireline compensation method in these examples can be applied to any system with a large number of peripheral driver circuitry and small area of array size. The spacing between metal lines can be adjusted to trade off between coupling and number of matchlines/bitlines to be compensated.

Higher density TCAM/CAM that use resistive-capacitive RC sensing schemes do not share sense amplifier across cells and this leads to wiring challenges and ML capacitance mismatch. ML capacitance mismatch results in timing uncertainty which degrades the sensing accuracy. The present invention mitigates these problems through an efficient wireline compensation technique.

As described in detail below, one example of the current invention is a ternary content addressable memory device for searching ternary data words. Each data bit in a data word is settable to one of three values of a first binary value (i.e., a "0" or low value), a second binary value (i.e., a "1" or high value), and a don't care value (i.e., a "X" value). The ternary content addressable memory device is comprised of a pair of two memory cells. Each individual memory cell includes a memory element and an access device electrically coupled in series with the memory element. Additionally, each memory cell is electrically coupled to a respective word line (WL) and a common match line (ML). In a particular configuration of the invention, the memory elements are phase change elements comprised of a phase change material, such as Germanium-Antimony-Tellurium (GST) and electrical contact electrode. In one particular embodiment of the invention, the memory elements may be programmed to one of two states: a low resistance state and a high resistance state. The combination of data stored in the pair of two memory cells in each TCAM cell represents one of the three data bit values. For example, high resistance state in both memory cells in each TCAM cell represent the don't care value, the high resistance state in one cell while the low resistance state in the other cell represents the first (high) binary value, and reversely, the low resistance state in one cell while the high resistance state in the other cell represents the second (low) binary value.

SRAM Binary CAM

FIG. 1 shows a two elements of a typical SRAM based ternary CAM cell 110. The term CAM cell is used to mean two elements of the ternary CAM cell. The identical description with reference to "Element 1" is applicable to "Element 2", as well. "Element 1" and "Element 2" together form, with the appropriate access circuitry, a ternary CAM cell. The ternary CAM cell stores one of three binary values for CAM operations, logical "0", logical "1", or "X" for "don't care". Returning to "Element 1", two inverters INV1 and INV2 form a latch that stores the true and complementary data on nodes N1 and N2. In the write mode, data is written into CAM cells through complementary writebitlines WBL1, $\overline{WBL1}$ through N-type metal oxide semiconductor (NMOS) transistor T1 and T2. In the precharge phase of the search mode, matchline (ML) is precharged to high. In the evaluation phase of the search mode, input data presented to the CAM are delivered to the CAM cells through selectline1 (SL1) and selectline2 (SL2).

When there is a match, the two gates in the path of T3 and T4 will have different polarity, so that one of the transistors in each path will be off. Thus, there is no current flowing between the match-line and ground line also know as a sink-line through a matched CAM cell.

On the other hand, when there is a mismatch, one of the two paths will have both transistors turned on and allow current flowing between the match-line (ML) and sink-line (not shown). Sink-line (not shown) is normally connected to ground and thus will discharge the match-line when a mismatch occurs. In an example of a 16 bit wide CAM, each match-line is connected to all sixteen CAM cells 110. When any of the CAM cells shows a mismatch, the match-line will be discharged quickly. If all cells match, the match-line will stay at high level and a match is found.

A CAM with SRAM as described above is now expanded to include a phase-change memory based ternary content addressable memory (PCM-TCAM), an array of PCM-TCAM cells, and peripheral circuits for the content addressable memory (CAM) operation, and for the random access memory (RAM) operation.

PCM Binary CAM

Figure 2:
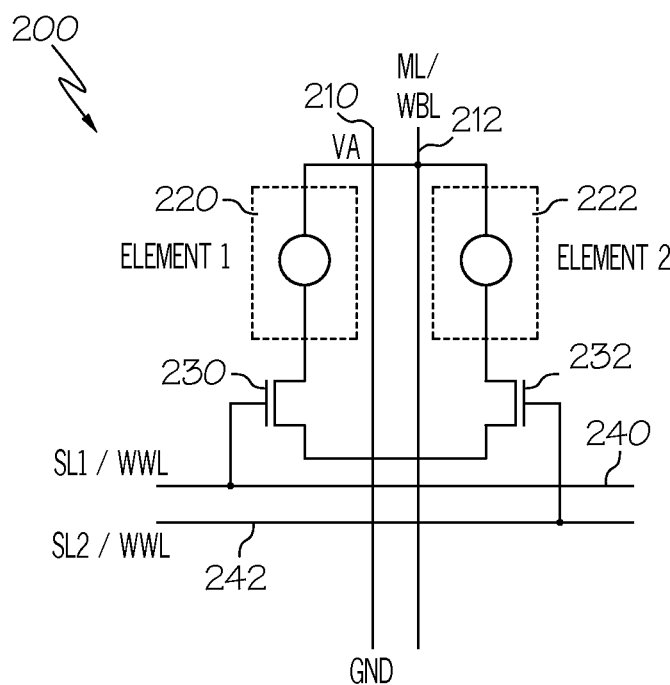
FIG. 2 illustrates a cell of a prior art PCM TCAM.

FIG. 2 shows a typical implementation of a phase change memory (PCM) cell 200. The PCM cell includes selectline1/writewordline (SSL1/WWL) 240, selectline2/writewordline (SSL2/WWL) 242, and matchline/writebitline (ML/WBL) 210, 212. Each PCM cell includes: (1) a phase change memory element 220, 222, represented by a circle, with one end connected to matchline/writebitline (ML/WBL) 210; (2) a n-type field effect transistor (nFET) 230, 232 that has its gate connected to the selectline/writewordlines (SSL1/WWL, SSL2/WWL) 240, 242 and its source and drain connected to GND 210 and the phase change material 220, 222, respectively. The ternary CAM cell stores one of three binary values for CAM operations, logical "0", logical "1", or "X" for "don't care".

The PCM TCAM cell 200 stores a ternary data value as one of three states. For example, high resistance state in both memory cells in each PCM-CAM cell 200 represent the don't care value, the high resistance state in one cell while the low resistance state in the other cell represents the first (high) binary value, and reversely, the low resistance state in one cell while the high resistance state in the other cell represents the second (low) binary value. During programming operations, voltage pulses are applied to the matchline/writebitline (ML\WBL) 210, 212 and selectline/writewordlines (SSL1/WWL, SSL2/WWL) 240, 242 based on a target programming value. In one embodiment of the invention, the voltage pulse applied to matchline/writebitline (ML\WBL) 210, 212 is high enough to change the phase change elements to an amorphous state (high resistance). One of the wordlines (SL1/WWL, SL2/WWL) 240, 242 is biased to turn on one of the access devices 230, 232. A suitable current or voltage pulse is then applied to the matchline/writebitline (ML\WBL) 210, 212 to program one of the memory elements 220, 222 to the desired resistance state.

CAM Sensing Circuit

Figure 3:
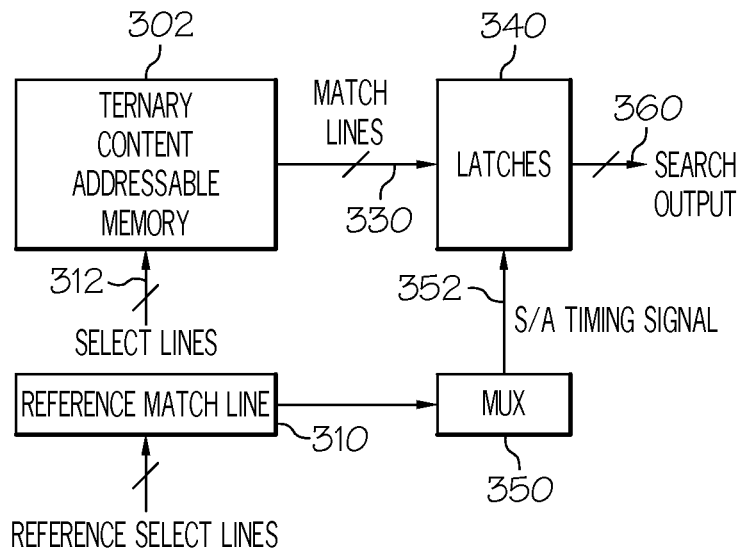
FIG. 3 a block diagram of a sensing circuitry coupled to TCAM cells.

FIG. 3 is a block diagram of sensing circuitry coupled to a TCAM array with a plurality of TCAM cells. During search operations, a search bit is compared with the stored data bit. The search data is applied to the selectlines (SSL1, SSL2) 312. The matchline 330 senses the collective effective resistance (Element 1, Element 2) of a plurality of memory cells such as PCM cell 200 of FIG. 2 or cell 110 of FIG. 1. In one embodiment of the invention, the matchline 330, senses the voltage decay 454 of the matchlines introduced by discharge current passing through the memory cell (Element 1, Element 2) and access device, such as 230, 232 of FIG. 2. A group of latches 340 stores the value of the match lines in accordance with the timing pulse CLK (S/A Timing Signal) 352, 424. Latches are triggered by reference CLK to differentiate match/no-match time delay. The final latch value forms the search output 360.

Figure 4:
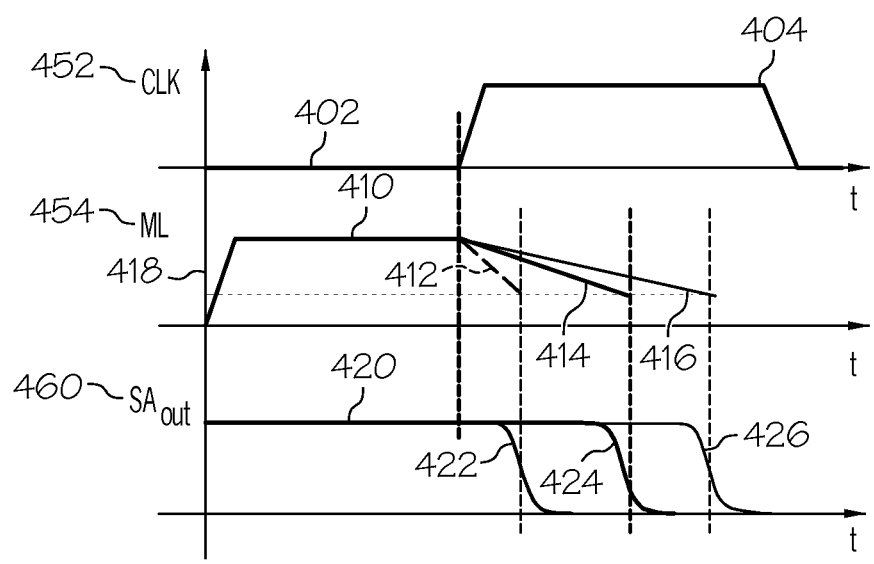
FIG. 4 is a waveform of the sensing circuitry of FIG. 3.

FIG. 4 is a waveform of a sensing circuitry of FIG. 3. The clock 452 is shown as wave form 402. The voltage of matchline (ML) 454 is shown. Notice the two slopes 412 (no match case) and 414 (match case) show different voltage discharge rate due to different RC constant of matchline. The $V_{trip}$ 418 illustrates the trigger voltage of SA's. The wave form 420 of search output ($SA_{out}$) 460 also illustrates two slopes 422 (no match case) and 424 (match case) illustrating the small sense margin in time-based TCAM sensing schemes due to resistance and capacitance mismatch largely because of variabilities in the matchlines. TCAM have small sense margins because of parallel wiring paths and poor array efficiency. This wireline mismatch is due to different metal lengths and manufacturing variability.

Figure 5:
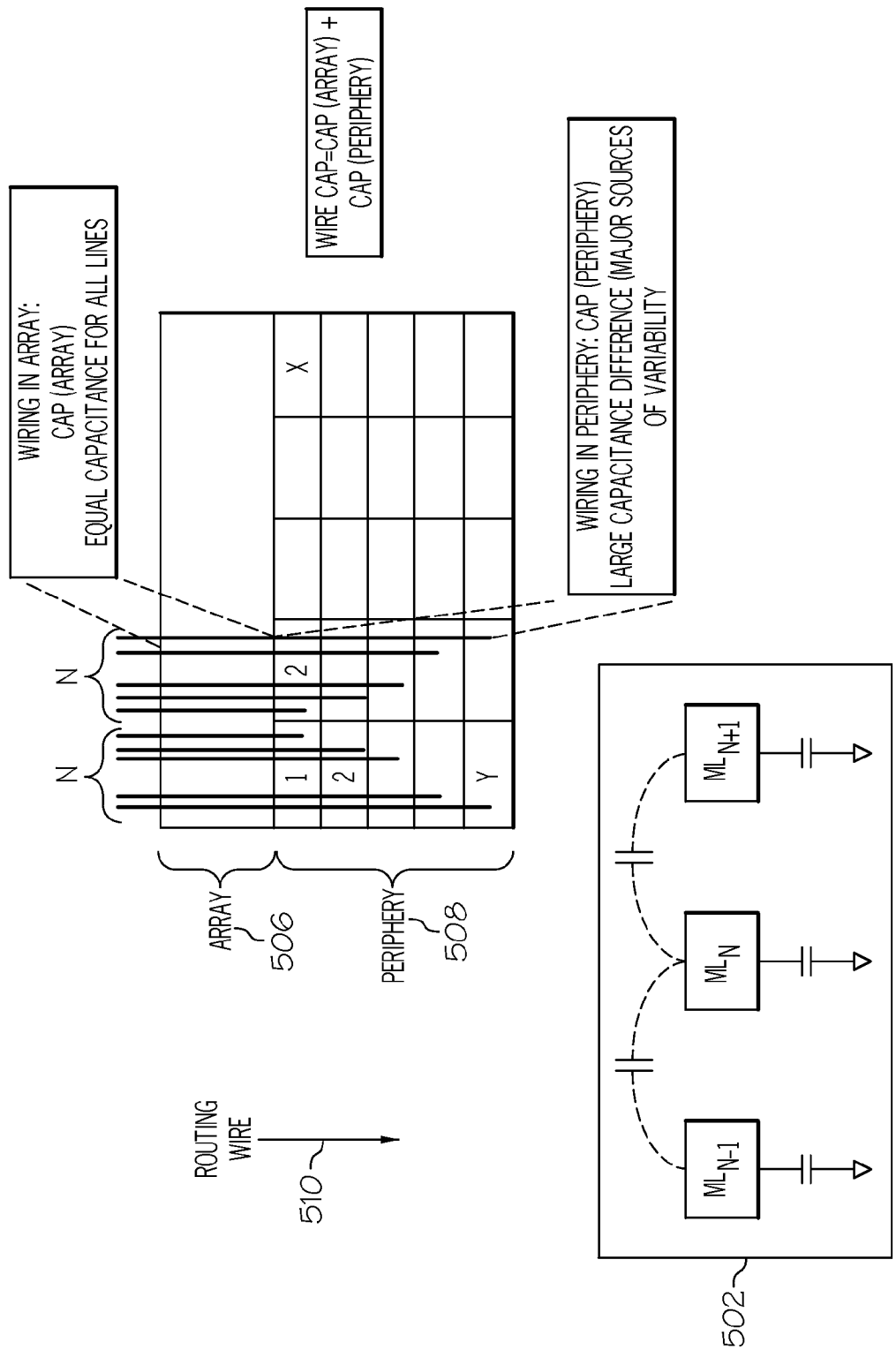
FIG. 5 illustrates match line capacitance mismatching.

FIG. 5 illustrates match line capacitance mismatching. Shown is a block diagram of matchline (ML) capacitance coupling 502. Diagrammatically, this is shown as $ML_{N-1}$, $ML_N$, $ML_{N+1}$ to represent the wires electrically coupled to each other. The wireline or ML wiring has two major components as shown in the wire routing 510, the wiring as part of the array 506 and the wiring as part of the periphery 508 that contributes to a large overall capacitance difference. Even assuming approximately equal capacitance for each ML in the array 506 there is ML-ML coupling. In this example, the wire routing is divided into subgroups of N wires. Other subgroups of any other number of wires are possible in other examples. Notice in this group the various lengths of wires in periphery 508 in the wire routing. For example, the longest matchline (ML) in a subgroup N may have a capacitance that is more than twice that of the shortest matchline (ML) in the subgroup N. Each square in FIG. 5-7 indicates a separate SA circuit attached to each ML.

Wireline Compensation

Figure 6:
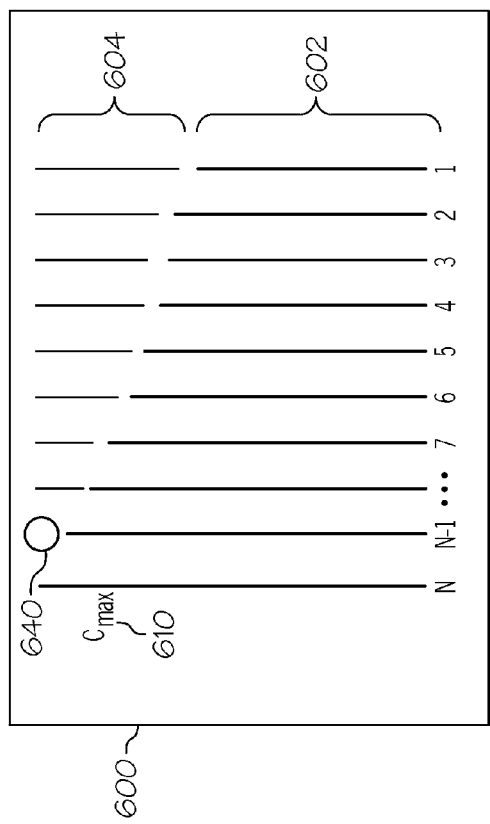
FIG. 6 illustrates a model of the matchline wireline compensation.

FIG. 6 illustrates a model 600 of the matchline wireline compensation. In this, model 600 wireline compensation is achieved by making the capacitance loading identical for each by adding wire to it. Stated differently, a small or short ML capacitance ($C_{ML}$) would have a longer add-on capacitance, whereas a longer $C_{ML}$ has a short add-on capacitance. A subgroup of wires N is shown in this model 600. The lower portion of each wire in the subgroup denoted 602 illustrate wirelines with different capacitances (before compensation) with a maximum capacitance $C_{MAX}$ 610. Continuing with this model 600, add-on capacitance to be added is denoted 604. In this model 600, the add-on capacitance 604 to be added to a number (NA) of the wires in the subgroup (N) is calculated in order to minimize a difference between the maximum capacitance ($C_{MAX}$) and a compensated wire capacitance to maximize the number of wires added NA, with NA≦N. The compensated wire capacitance is the add-on capacitance plus the capacitance of each wire (C1, C2 . . . CN). Notice in this example there is no wire added to wire N−1 denoted 640. This is because wire N−1 already has a capacitance close to $C_{MAX}$ and the number of additional routing lines in most memory array architectures is limited.

Figure 7:
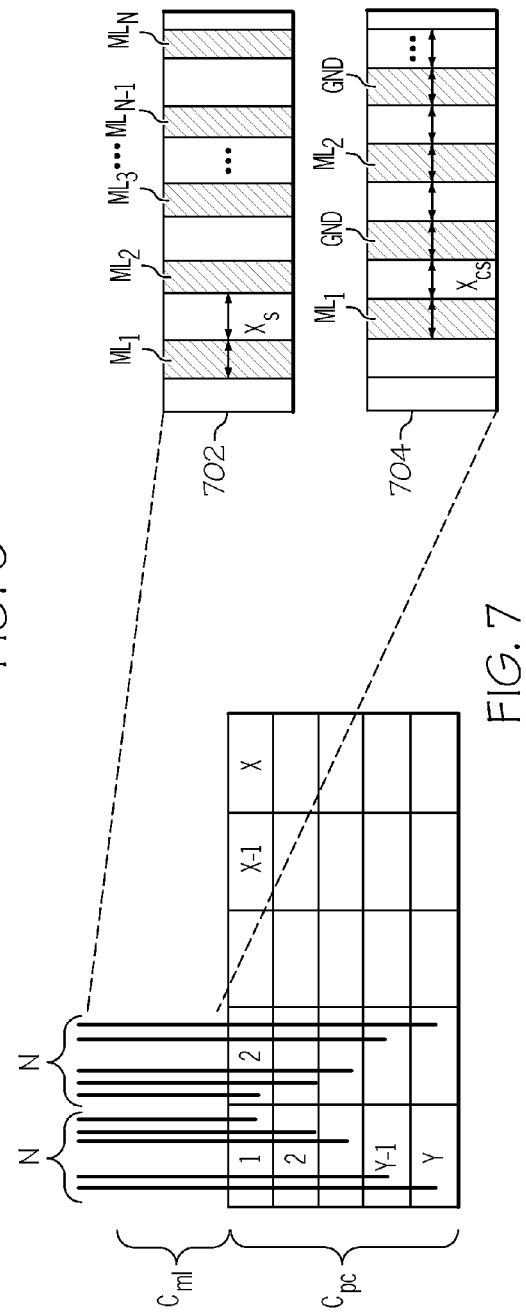
FIG. 7 illustrates the match line wireline compensation design with a ground wire using the compensation model of FIG. 6.

FIG. 7 illustrates match line wireline compensation with a ground wire using the compensation model 600 of FIG. 6. The ground wire electrically isolates the neighboring compensated wirelines to ensure no additional coupling capacitance introduced to each matchline while doing compensation.

Again, the wireline or ML wiring has two major components, denoted as $C_{ML}$ representing the capacitance of the matchline and $C_{PC}$ representing the capacitance of the peripheral circuitry. Wireline compensation is achieved by making the capacitance loading identical for each by adding wire to it. Stated differently, a small or short ML capacitance ($C_{ML}$) would have a longer addi-oncapacitance, whereas a longer $C_{ML}$ has a short add-on capacitance. The original ML wire and compensating wire are shown schematically 702 and 704. The ML capacitance ($C_{ML}$) 702 is compensated by adding lump capacitance through a different manufacturing layer(s) 704. The compensating capacitance 704 is designed in order to effectively minimize ML capacitance mismatch and to minimize additional coupling. In this example, the compensating wires comprise a GND shield line added between each ML as shown schematically in 704.

In examples with ground shield wires being added as part of the compensation in order to reduce coupling, the ground shield wires may have different pitches. ML spacing ($X_S$) or width of each matchline is shown. The area of each matchline is used to calculate a capacitance (C1, C2 . . . Cn) of each wire in the subgroup. A total area of each wire in the subgroup (A1+A2 . . . An) is calculated to estimate the total area constraint for compensating wires in a subgroup known from the routing design.

The coupling capacitance is a function of wire space in each subgroup.

$$\text{Max}(CTOTAL) = \text{Max}(CML + CPC) \leq CMAX$$

where

CML is first part of matchline capacitance in memory array;

CPC is second part of matchline capacitance in peripheral circuit;

CMAX is target maximum capacitance of a wire in the subgroup (N) after compensation.

Figure 8:
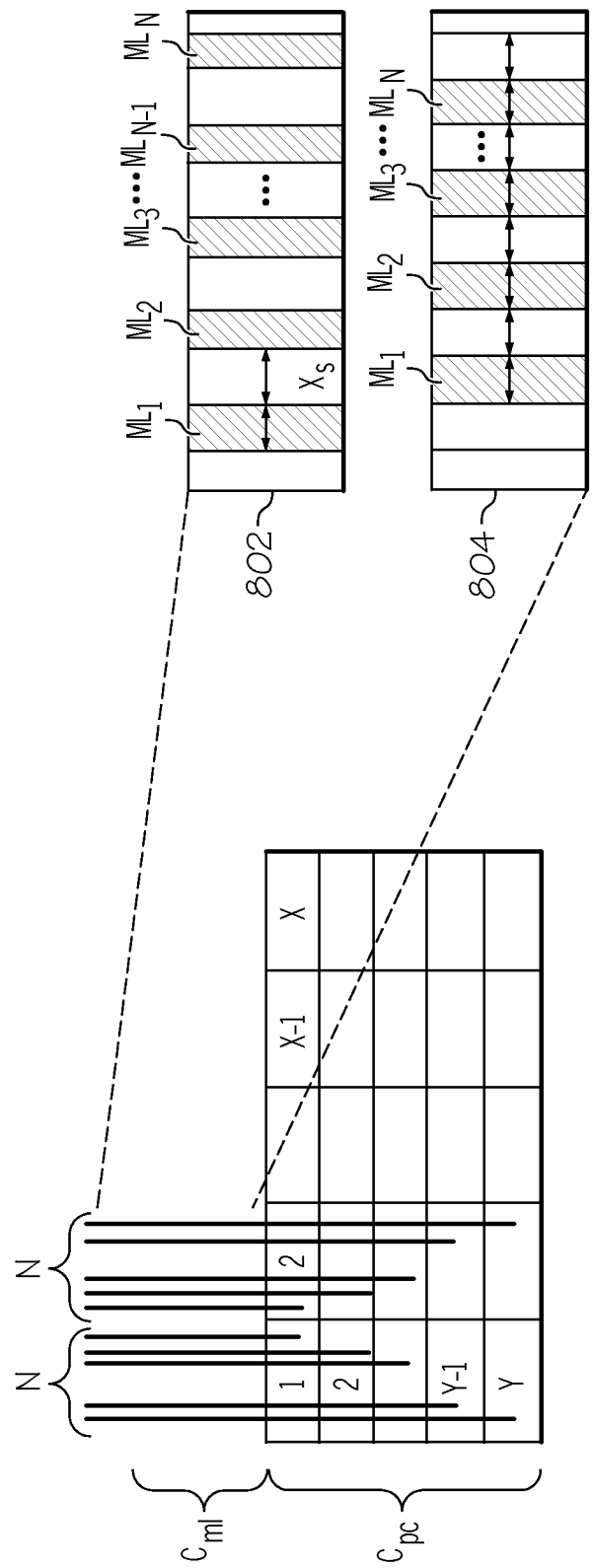
FIG. 8 illustrates the match line wireline compensation design without a ground wire using the compensation model of FIG. 6.

FIG. 8 illustrates match line wireline compensation without a ground wire using the compensation model 600 of FIG. 6. In one embodiment, wireline compensation is achieved by making the capacitance loading identical for each by adding wire to it. Stated differently, a small or short ML capacitance ($C_{ML}$) would have a longer compensating capacitance, whereas a longer $C_{ML}$ has a short compensating capacitance.

Compensation Process Flow

Figure 9:
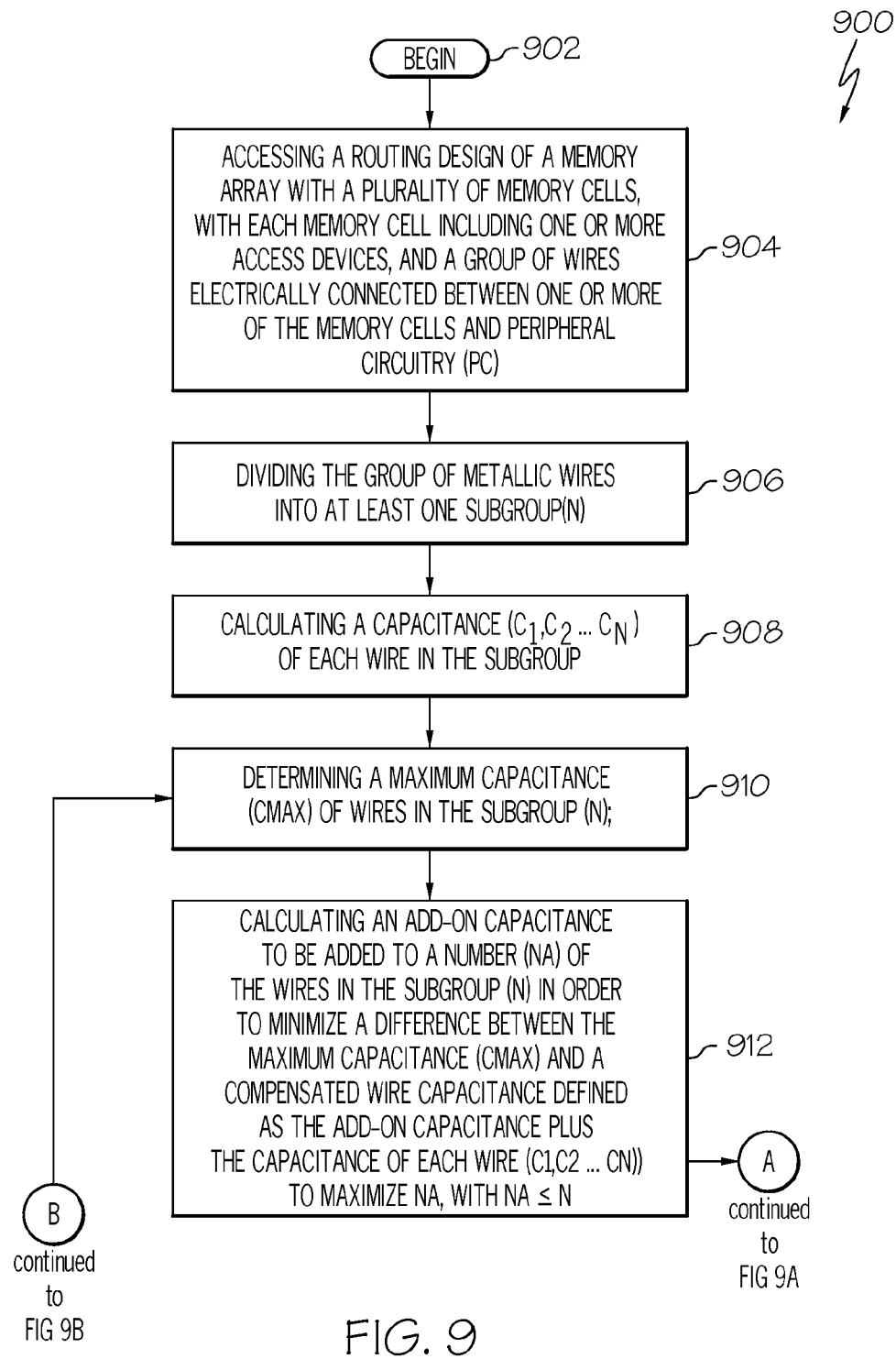
FIGS. 9-10 is a flow diagram of the wireline compensation method using the compensation model of FIG. 6.
Figure 10:
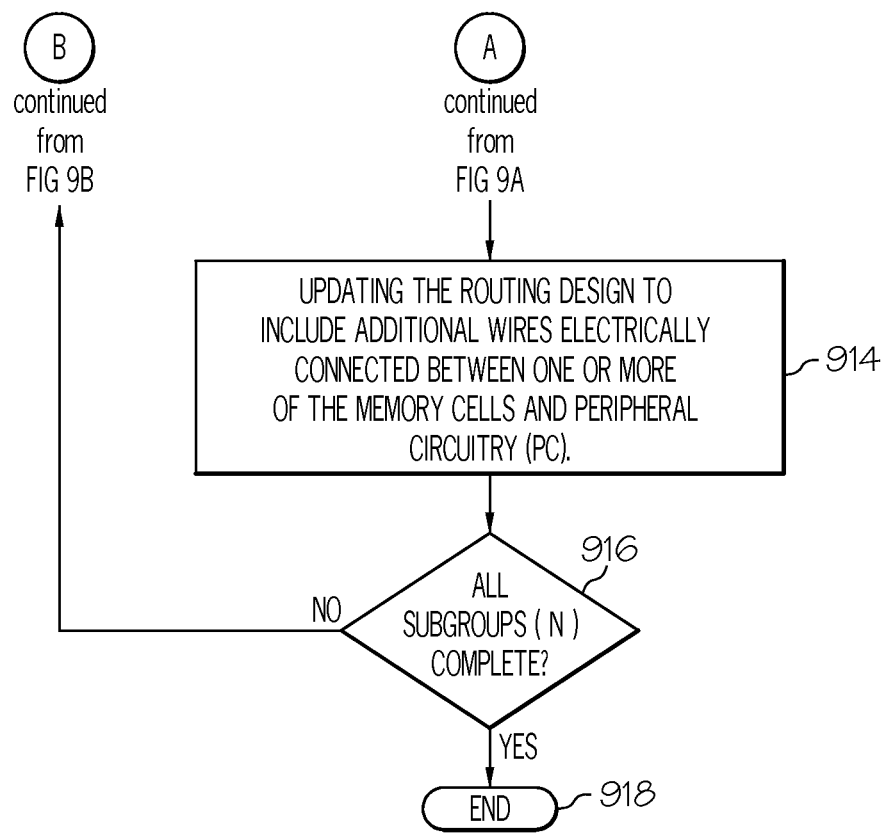

FIGS. 9-10 is a flow diagram of the wireline compensation method using the compensation model 600 of FIG. 6. The flow minimizing timing uncertainty in memory arrays by compensating for wireline variations and by minimizing capacitance mismatch. The process flow 900 begins at step 902 and immediately proceeds to step 904 in which a routing design of a memory array with a plurality of memory cells is accessed. Each memory cell includes one or more access devices, and a group of wires electrically connected between one or more of the memory cells and peripheral circuitry (PC). Next in step 906, the group of metallic wires is divided into at least one subgroup (N). For each wire in the subgroup a capacitance (C1, C2 ... CN) is calculated in step 908. In step 912, a maximum capacitance (CMAX) of wires in the subgroup (N) is determined. An add-on capacitance to be added to a number (NA) of the wires in the subgroup (N) is calculated. More specifically, the add-on capacitance is calculated in order to minimize a difference between the maximum capacitance (CMAX) and a compensated wire capacitance defined as the add-on capacitance plus the capacitance of each wire (C1, C2 ... CN) to maximize the number (NA) of wires in the subgroup. The number of wires (NA) is less than or equal to a number of wires in the subgroup ($\leq$N). A routing design in step 914 is updated to include the additional wires connected between one or more of the memory cells and the periphery circuit (PC). A test is made in step 916, if all subgroups (N) are complete. In this case, no other subgroups need to be compensated and the process returns to step 910. Otherwise, the process terminates in step 918.

Example Design Process

The embodiments of the present invention described above are meant to be illustrative of the principles of the present invention. These device fabrication processes are compatible with conventional semiconductor fabrication methodology, and thus various modifications and adaptations can be made by one of ordinary skill in the art. All such modifications still fall within the scope of the present invention. For example, the various layer thicknesses, material types, deposition techniques, and the like discussed above are not meant to be limiting.

Furthermore, some of the features of the examples of the present invention may be used to advantage without the corresponding use of other features. As such, the foregoing description should be considered as merely illustrative of the principles, teachings, examples and exemplary embodiments of the present invention, and not in limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

Figure 11:
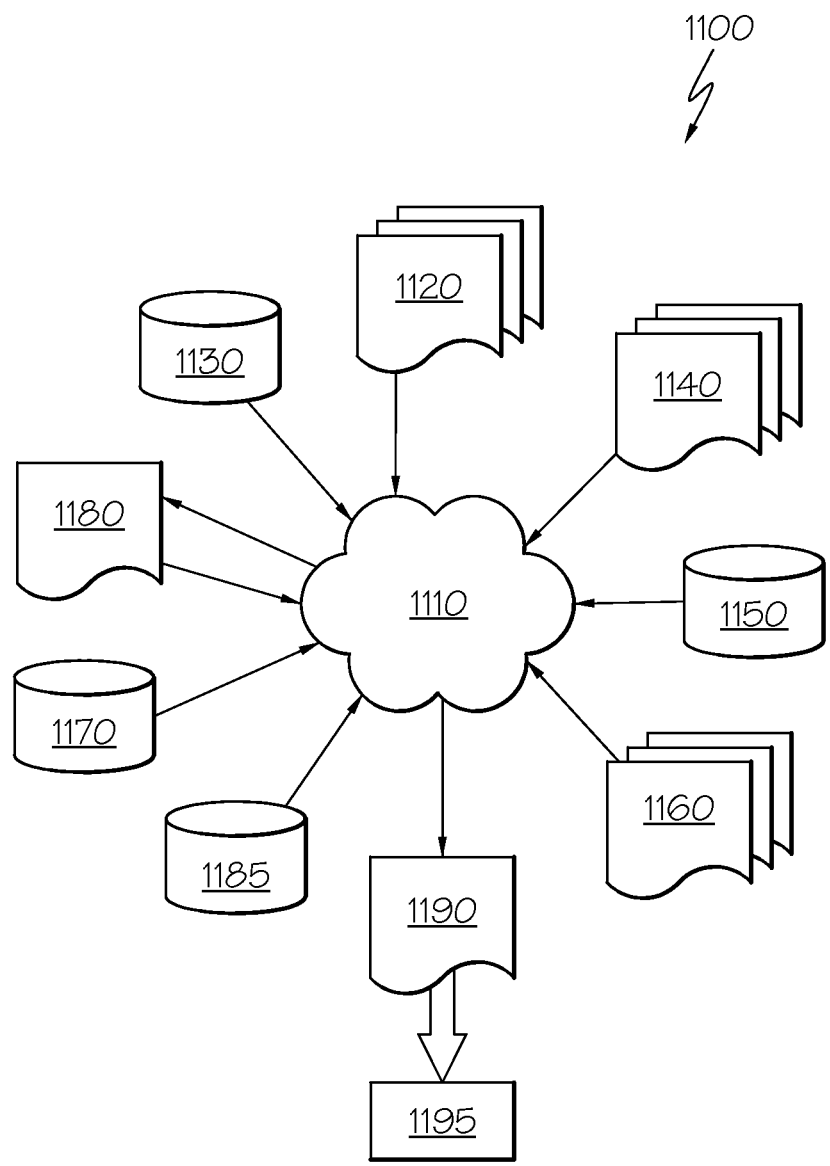
FIG. 11 is a block diagram of an exemplary design flow.

FIG. 11 shows a block diagram of an exemplary design flow 1100 used for example, in semiconductor IC logic design, simulation, test, layout, and manufacture. Design flow 1100 includes processes and mechanisms for processing design structures or devices to generate logically or otherwise functionally equivalent representations of the design structures and/or devices described above and shown in FIGS. 1-1. The design structures processed and/or generated by design flow 1100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 1100 may vary depending on the type of representation being designed. For example, a design flow 1100 for building an application specific IC (ASIC) may differ from a design flow 1100 for designing a standard component or from a design flow 1100 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 1120 that is preferably processed by a design process 1110. Design structure 1120 may be a logical simulation design structure generated and processed by design process 1110 to produce a logically equivalent functional representation of a hardware device. Design structure 1120 may also or alternatively comprise data and/or program instructions that when processed by design process 1110, generate a functional representation of the physical structure of a hardware device. Whether representing functional and/or structural design features, design structure 1120 may be generated using electronic computer-aided design (ECAD) such as implemented by a core developer/designer. When encoded on a machine-readable data transmission, gate array, or storage medium, design structure 1120 may be accessed and processed by one or more hardware and/or software modules within design process 1110 to simulate or otherwise functionally represent an electronic component, circuit, electronic or logic module, apparatus, device, or system such as those described in the figures above. As such, design structure 1120 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL), design entities, or other data structures conforming to and/or compatible with lower-level HDL design languages such as Verilog and VHDL, and/or higher level design languages such as C or C++.

Design process 1110 preferably employs and incorporates hardware and/or software modules for synthesizing, translating, or otherwise processing a design/simulation functional equivalent of the components, circuits, devices, or logic structures described in the figures above to generate a netlist 1180 which may contain design structures such as design structure 1120. Netlist 1180 may comprise, for example, compiled or otherwise processed data structures representing a list of wires, discrete components, logic gates, control circuits, I/O devices, models, etc. that describes the connections to other elements and circuits in an integrated circuit design. Netlist 1180 may be synthesized using an iterative process in which netlist 1180 is resynthesized one or more times depending on design specifications and parameters for the device. As with other design structure types described herein, netlist 1180 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1110 may include hardware and software modules for processing a variety of input data structure types including netlist 1180. Such data structure types may reside, for example, within library elements 1130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1140, characterization data 1150, verification data 1160, design rules 1170, and test data files 1185 which may include input test patterns, output test results, and other testing information. Design process 1110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1110 without deviating from the scope and spirit of the invention. Design process 1110 may also include modules for performing standard circuit design processes such as timing analysis, verification, design rule checking, place and route operations, etc.

Design process 1110 employs and incorporates logic and physical design tools such as HDL compilers and simulation model build tools to process design structure 1120 together with some or all of the depicted supporting data structures along with any additional mechanical design or data (if applicable), to generate a second design structure 1190. Design structure 1190 resides on a storage medium or programmable gate array in a data format used for the exchange of data of mechanical devices and structures (e.g., information stored in a ICES, DXF, Parasolid XT, JT, DRG, or any other suitable format for storing or rendering such mechanical design structures). Similar to design structure 1120, design structure 1190 preferably comprises one or more files, data structures, or other computer-encoded data or instructions that reside on transmission or data storage media and that when processed by an ECAD system, generate a logically or otherwise functionally equivalent form of one or more of the embodiments of the invention shown in FIGS. 1-10. In one embodiment, design structure 1190 may comprise a compiled, executable HDL simulation model that functionally simulates the devices shown in FIGS. 6-11.

Design structure 1190 may also employ a data format used for the exchange of layout data of integrated circuits and/or symbolic data format (e.g., information stored in a GDSII (GDS2), GL1, OASIS, map files, or any other suitable format for storing such design data structures). Design structure 1190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 6-11. Design structure 1190 may then proceed to a stage 1195 where, for example, design structure 1190: proceeds to tape-out, is released to manufacturing, is released to a mask house, is sent to another design house, is sent back to the customer, etc.

Non-Limiting Examples

Those skilled in the relevant art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present invention.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, conventional processor, controller, microcontroller, state machine, etc. A processor can also be implemented as a combination of computing devices, e.g., a combination of a DSP and a microprocessor, a plurality of microprocessors, one or more microprocessors in conjunction with a DSP core, or any other such configuration. In addition, the term "processing" is a broad term meant to encompass several meanings including, for example, implementing program code, executing instructions, performing arithmetic operations, and the like.

Having described preferred embodiments for the content addressable memory device (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for reducing wireline variability in a memory array comprising:

accessing a routing design of a memory array with a plurality of memory cells, with each memory cell including one or more access devices, and a group of wires electrically connected between one or more of the memory cells and peripheral circuitry;

dividing the group of wires into at least one subgroup;

calculating a capacitance of each wire in the subgroup;

determining a maximum capacitance of wires in the subgroup; and calculating an add-on capacitance to be added to a number of the wires in the subgroup in order to minimize a difference between the maximum capacitance and a compensated wire capacitance defined as the add-on capacitance plus the capacitance of each wire to maximize the number of wires in the subgroup, with the number of wires being less than or equal to a number of wires in the subgroup.

2. The method of claim 1, wherein the accessing the routing design of the memory array includes accessing a total area constraint of additional routing lines available and wherein the calculating the area of an add-on capacitance to be added is not greater than the total area constraint.

3. The method of claim 1, further comprising:

updating the routing design to include additional wires electrically connected between one or more of the memory cells and peripheral circuitry.

4. The method of claim 3, wherein the updating the routing design to include at least a subset of additional wires with a separate ground wire to reduced cross-capacitance.

5. The method of claim 1, wherein the calculating the capacitance of each wire in the subgroup includes calculating the capacitance of each wire based on at least one characteristic of the wires.

6. The method of claim 5, wherein the characteristic of the wires includes at least one of:

a width of the wires in the subgroup;

a length of the wires in the subgroup;

a distance between at least two of the wires in the subgroup; and a material property of the wires and material, within the memory cells and the peripheral circuitry, surrounding the wires in the subgroup.

7. The method of claim 1, wherein the calculating the add-on capacitance of the group of wires in the subgroup includes calculating the add-on capacitance for wires in the memory cell and in the peripheral circuitry.

8. The method of claim 1, the method further comprising:

repeating each step above until each subgroup has calculated an add-on capacitance to be added to a number of wires.

9. The method of claim 1, wherein the accessing the routing design of a memory array with a plurality of memory cells includes accessing a routing design for at least one of:

content-addressable memory (CAM); and ternary content-addressable memory (TCAM).

10. A memory array comprising:

a plurality of memory cells, with each memory cell including one or more access devices, and a group of wires electrically connected between one or more of the memory cells and peripheral circuitry;

at least one subgroup of wires selected from the group of wires; and a group of compensation wires added to the subgroup of wires, and electrically connected between one or more of the memory cells and the peripheral circuitry, the group of compensation wires including an add-on capacitance added to a number of the wires in the subgroup in order to minimize a difference between the maximum capacitance and a compensated wire capacitance defined as the add-on capacitance plus a capacitance of each wire in the subgroup of wires to maximize the number of wires, with the number of wires being less than or equal to a number of wires in the subgroup.

11. The memory array of claim 10, wherein the group of compensation wires added to the number of wires in the subgroup includes the add-on capacitance added not greater than a total area constraint of additional routing lines available in a routing design of the memory array.

12. The memory array of clam 10, wherein the compensation wires include at least a subset of additional wires with a separate ground wire to reduced cross-capacitance.

13. The memory array of claim 10, wherein the capacitance of each wire in the subgroup is based on at least one characteristic of the wires.

14. The memory array of claim 13, wherein the characteristic of the wires includes at least one of:

a width of the wires in the subgroup;

a length of the wires in the subgroup;

a distance between at least two of the wires in the group of wires in the subgroup; and a material property of the wires and material, within the memory cells and the peripheral circuitry, surrounding the wires in the subgroup.

15. The memory array of claim 14, wherein the add-on capacitance of the group of wires in the subgroup includes add-on capacitance for wires in the memory cell and in the peripheral circuitry.

16. The memory array of claim 10, wherein the memory cells are at least one of:

content-addressable memory (CAM); and ternary content-addressable memory (TCAM).

* * * * *